United States Patent [19]
Clark et al.

[11] 3,970,923
[45] July 20, 1976

[54] APPARATUS FOR MEASURING SHEET RESISTIVITY OF SEMICONDUCTOR MATERIALS AND DIFFUSED LAYERS

[75] Inventors: George Reed Clark; Kenneth Charles Winkleblack, both of Mountain View, Calif.

[73] Assignee: Hewlett-Packard Company, Palo Alto, Calif.

[22] Filed: Oct. 9, 1974

[21] Appl. No.: 513,425

[52] U.S. Cl. .............................. 324/64; 324/158 P; 330/9; 330/30 D
[51] Int. Cl.² ........................................ G01R 27/14
[58] Field of Search .............. 324/64, 158 D, 158 P; 330/30 D

[56] References Cited
UNITED STATES PATENTS

| | | | |
|---|---|---|---|
| 2,954,521 | 9/1960 | McKee | 324/158 P |
| 3,048,776 | 8/1962 | Logan | 324/64 |
| 3,312,893 | 4/1967 | Currin et al. | 324/64 |
| 3,801,919 | 4/1974 | Wilkes et al. | 330/51 |

OTHER PUBLICATIONS

Till, A. W., "Pneumatic Contact Probe," IBM Tech. Disclosure Bulletin, vol. 13, No. 6, 1970, p. 1551.

*Primary Examiner*—John K. Corbin
*Assistant Examiner*—Wm. H. Punter
*Attorney, Agent, or Firm*—Theodore S. Park

[57] ABSTRACT

A device for measuring sheet resistivity of semiconductor materials and diffused layers uses a linear four-point probe having pneumatically-actuated contact pins coupled to a self-zeroing voltage amplifier and a current source having extremely high output resistance.

3 Claims, 8 Drawing Figures

APPARATUS FOR MEASURING SHEET RESISTIVITY OF SEMICONDUCTOR MATERIALS AND DIFFUSED LAYERS

BACKGROUND OF THE INVENTION

Conventional devices used for measuring sheet resistivity are limited in their measurement range and accuracy by variances in probe pressure, probe spacing and by the circuits employed as a current source and a voltage amplifier. Means for ensuring uniform pin pressure on a sample is required since data consistency is directly affected by the load or force with which each probe is pressed into a sample. The current source must have very high output resistance in order to maintain a selected current value over a wide range of voltages and a large voltage range is required not only by the varied resistances seen between the outer two probes, but also by the potential necessary to achieve avalanche breakdown of point-contact diodes formed when the probes touch lightly-doped wafers. These diodes have typically made the accurate measurement of high resistivity wafers difficult, if not impossible. For low-resistivity wafers, the voltage signal must usually be highly amplified; for example, gains of $10^5$ are not uncommon. Drift in a d.c. amplifier's input offset voltage due to time and temperature variations can mask the actual data when such low magnitude voltages are of interest. Thus, the amplifier must be very stable, or some means of correcting the drift errors must be provided. For high-resistivity wafers, point-contact diodes are also formed at the probes. Since all practical amplifiers require some input bias current, the voltage drop required across these diodes in order to allow this bias current flow produces errors at the input of the voltage amplifier. Some means must be provided for correcting these errors.

The value of sheet resistivity is typically found by dividing voltage by a current and multiplying the result by a constant. Conventional systems set the current equal to this constant. Such a technique does not necessarily yield the most desirable value of current. Furthermore, if various wafer geometries are to be accepted, the constant and thus the current must be variable. This leads to difficulty in accurately setting the current. A better method would be to set the current at the desired value and make the constant adjustable by actually performing a data multiplication.

SUMMARY OF THE INVENTION

A probe head having four contact pins pneumatically actuated is coupled to a very accurate current source having three selectable values and a self-compensating voltage amplifier. The three selectable current values are not externally adjustable and are precisely calibrated. A voltage signal is detected by applying the current source to two outermost-positioned contact pins and feeding a detected voltage from the two innermost-positioned contact pins to an amplifier which has the ability to detect error voltages at its input and correct for their effects. This amplifier is initially connected to a test wafer with the current source disabled. The point-contact diode voltages are thus zeroed out of the data as is any input offset voltage of the amplifier. The amplifier has several gain ranges to allow a full-scale output over a large span of input voltages.

The amplified voltage is converted to a binary format by an analog-to-digital converter. This digital data is multiplied by a constant multiplier which is digitally selectable by setting thumbwell switches. The resulting value of sheet resistivity is converted to BCD format for display.

DESCRIPTION OF THE PREFERRED EMBODIMENT

Figure 1:
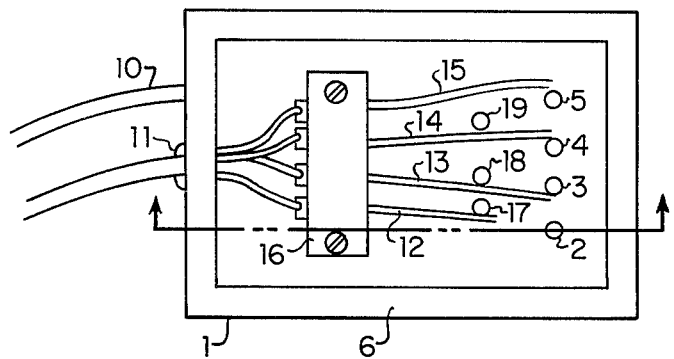
FIG. 1 shows a top view of a probe head made in accordance with a preferred embodiment of the invention.

Referring to FIG. 1, a probe head 1 consists of four precision gauge pins 2, 3, 4, 5 which are cut to a length of three-fourths of an inch, machined spherical on one end and gold-plated on the other and are custom fit to a head structure 6 that is made, for example of Teflon AF or the like.

Figure 2:
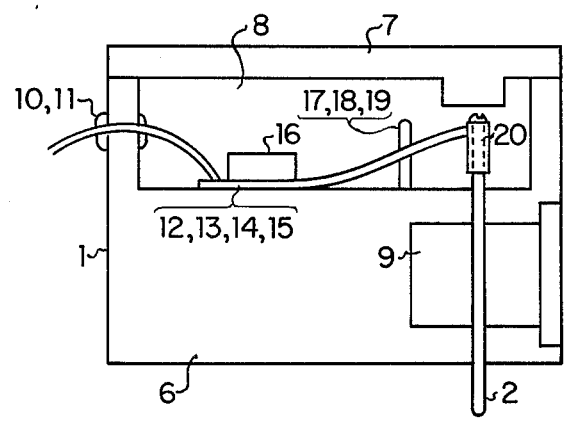
FIG. 2 is a sectional view of the embodiment of FIG. 1.

Referring to FIG. 2, the head 1 consists of a lid 7 and body structure 6. The body 6 has two major cavities, the upper cavity 8 is the main pressure chamber and the lower one is a secondary pressure chamber 9 which reduces the pin-to-head contact area while maintaining precise alignment of each of the pins 2, 3, 4, and 5. The main pressure chamber 8 has two sealed inlets, one for high pressure air 10 and another for the electrical connections 11. Four incoming wires are soldered to gold ribbons (0.001 × 0.040) 12, 13, 14, 15. The ribbon is clamped in place by, for example, a Teflon block 16 or the like, then twists 90° passing by Teflon separating pins 17, 18, 19 and is soldered to the gold-plated end 20 of each pin.

Figure 3:
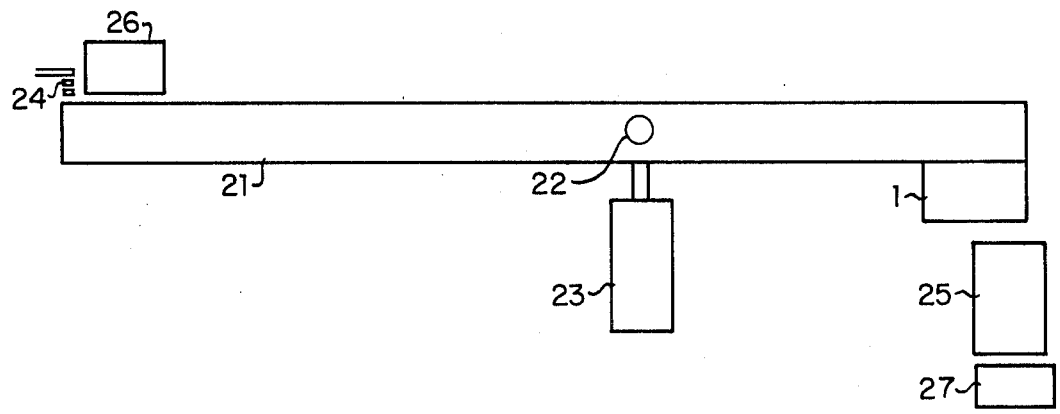
FIG. 3 shows a means for applying the probe head of FIG. 1 to a semiconductor device to be measured.

Referring to FIG. 3, the head assembly 1 is attached to an aluminum bar 21 which is pivoted in the middle 22. The bar 21 is lowered by actuating a pneumatic cylinder 23. The extent of the bars travel is determined by an adjustable stop 24 which positions the head 1 within pin contact range of a wafer to be measured which is held in a pedestal 25. To prevent blowing the pins out of the head an interlocking system is provided consisting of two microswitches 26 and 27. These switches 26, 27 detect when the arm 21 is down and the pedestal 25 is in place and only when these two conditions exist will the head 1 be pressurized.

Figure 4:
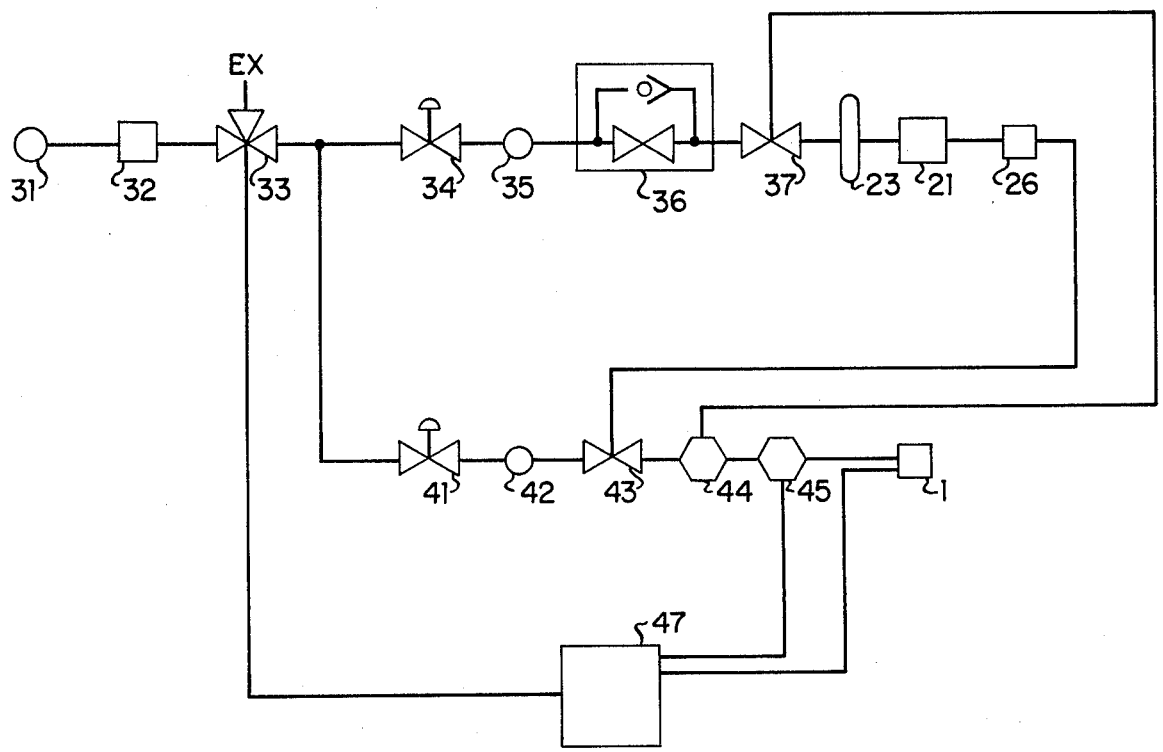
FIG. 4 shows a pneumatic control system for the means of FIG. 3.

Referring to FIG. 4, pneumatic controls are shown in schematic form. A push-button switch 31 actuates a microswitch 32 which controls a three-way pneumatic valve 33. The pneumatic valve 33 applies pressure by means of a pneumatic pressure regulator 34 and a pressure gauge 35 to flow control means 36. Flow control means 36 applies pressure to two-way pneumatic valve 37 which communicates with the pneumatic cylinder 23 and a two-way pneumatic valve 43. The pneumatic cylinder 23 actuates the arm assembly 21. When arm assembly 21 is in a down position microswitch 26 is actuated and controls two-way pneumatic valve 43. Valve 43 receives pressure via a pressure gauge 42 and pressure regulator 41 from three-way pneumatic valve 33. Valve 43 communicates with the probe head 1 by means of a pressure-activated electric switch 44 controlling the two-way pneumatic valve 37 and pressure-actuated electric switch 45. Electric switch 45 and probe head assembly 1 are electrically connected to electrical logic means 47 which control the three-way pneumatic valve 33.

Figure 5:
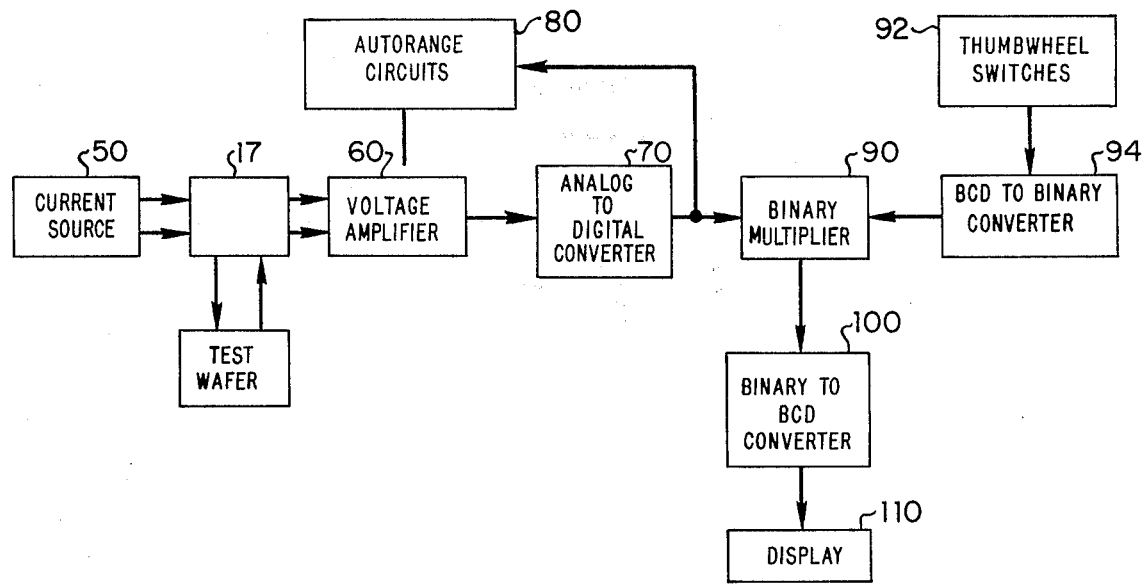
FIG. 5 is a block diagram of a system for applying current to and measuring sheet resistivity of a semiconductor wafer.

Referring to FIG. 5, there is shown an overall block diagram of a system for applying current and measuring voltage. Current source 50 applies current to pins 2 and 5 of probe head 1 which is in contact with a wafer to be tested. A voltage amplifier 60 has its input coupled to pins 3 and 4 of the probe head. The voltage amplifier 60 applies an amplified output to an analog-to-digital converter 70 whose output is fed back to voltage amplifier 60 by autorange circuits 80. Converter 70 also applies an output to a binary multiplier 90 which drives a binary-to-BCD converter 100 to provide a display 110. Thumbwheel switches 92 control a BCD-to-binary converter 94 driving the binary multiplier 90.

Figure 6:
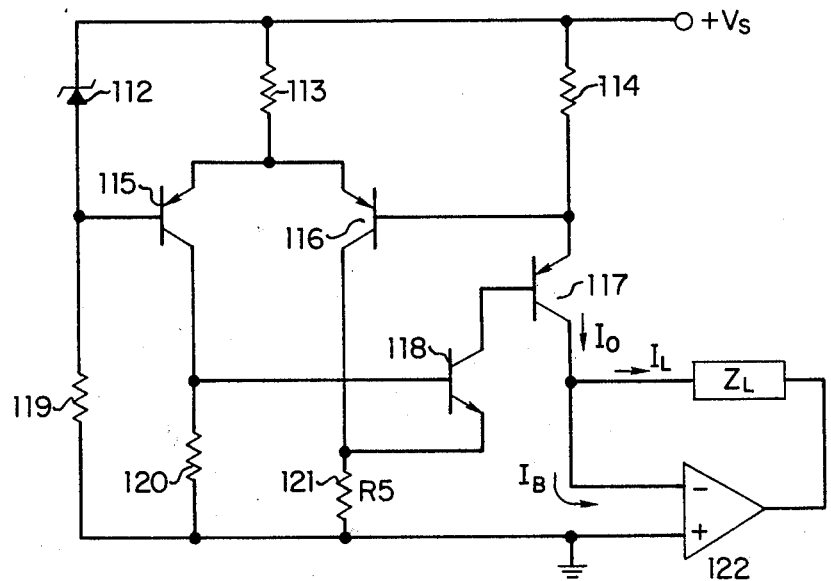
FIG. 6 is a detailed schematic diagram of a current source made in accordance with a preferred embodiment of the invention.

Referring to FIG. 6, there is shown a detailed schematic diagram of the current source 50. Current $I_o$ is supplied to a load $Z_1$ from the collector of a transistor 117. Transistors 116 and 117 are selected to have high current gains so the vast portion of the collector current of transistor 117 flows through resistor 114.

Transistors 115 and 116 form a differential amplifier which drives transistors 117 and 118 in such a manner as to keep the voltages on the bases of transistors 115 and 116 equal. Therefore, the collector current of transistor 117 is approximately given as $V_{112}/R_{114}$ where $V_{112}$ is the voltage of a Zener diode 112 and $R_{114}$ is the resistance of resistor 114. The biased Zener diode 112 is thereby used as a reference voltage source. 112 is chosen to be temperature stable, and transistors 115 and 116 are a matched transistor pair whose emitter-base voltages have equal changes with temperature. Thus, the constant current supplied at the collector of transistor 117 is not sensitive to temperature changes.

The current from the collector of transistor 117 is divided into $I_B$, which is the input bias current of an operational amplifier 122, and $I_L$, which is the current that flows through a load impedance $Z_L$ representing the load of a test wafer. Operational amplifier 122 is chosen so that its input bias current, $I_B$, is very small as compared with the current from the collector of transistor 117. Thus, the load current, $I_L$, is approximately equal to the constant current from the collector of transistor 117; $I_L = I_o$.

Figure 7:
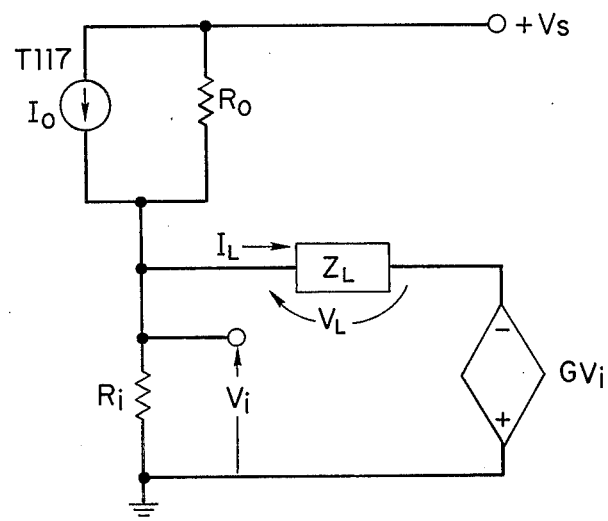
FIG. 7 is an equivalent functional diagram of the current source of FIG. 6.

The function of amplifier 122 is to increase the output resistance of the constant current source 50. This can be seen from FIG. 7 where the current that flows from the collector of transistor 117 is shown as being produced by a constant current source T117 with finite output resistance $R_o$. Also in FIG. 7 the operational amplifier 122 is assumed to have an input resistance, $R_i$, and an open-loop voltage gain of G. The voltage between the inputs of the amplifier 122 is given by $V_i$, and the voltage across the load is $V_L$. From the circuit shown in FIG. 7, $$I_L = I_o + \frac{V_s}{R_o} - \frac{V_L}{(G+1)} \left( \frac{R_i + R_o}{R_i R_o} \right)$$

Vs being the voltage of an applied voltage source. The output resistance of the equivalent current source seen by the load is $$-\frac{dV_L}{dI_L} = (G+1) \left( \frac{R_i R_o}{R_i + R_o} \right)$$

Therefore, the output resistance is the parallel combination of $R_i$ and $R_o$ multiplied by the open-loop gain of the amplifier 122. This large value of resistance makes the circuit configuration unique and is the means by which the wafer current can be held constant over a wide voltage range.

Figure 8:
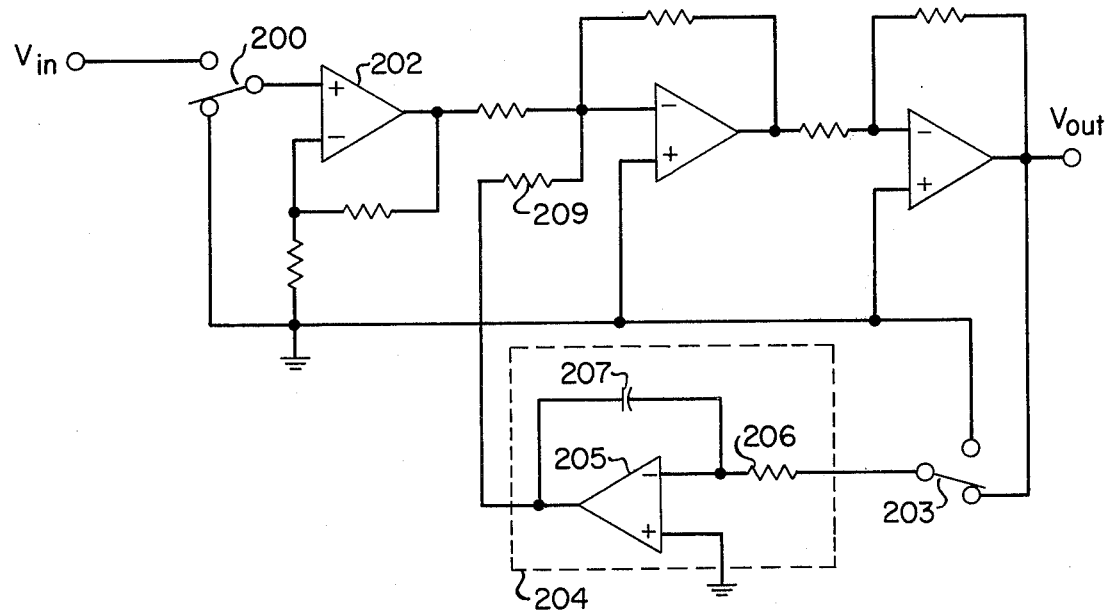
FIG. 8 is a schematic diagram of a self-zeroing voltage amplifier made in accordance with a preferred embodiment.

To achieve the high gain necessary for measuring low resistivity wafers, the voltage amplifier 60 consists of three stages, each having moderate gains. The first stage is configured to achieve high input impedance by using its positive terminal as the input. The final output of the amplifier 60 is detected by an integrator and used to eliminate offset errors. Referring to FIG. 8, there is shown a circuit representing amplifier 60 in the stand-by mode. Switch 200 applies 0 volts to an input of amplifier 60 while switch 203 connects an output of amplifier 60 to an integrator 204 formed by operational amplifier 205, resistor 206 and capacitor 207. If any offset voltage is present in the amplifier 60, $V_{out}$ will not be zero, and the integrator 204 will produce a voltage of growing magnitude which is introduced through resistor 209 back into the amplifier 60 in a proper polarity to drive $V_{out}$ towards zero. When $V_{out}$ reaches zero, the integrator 204 becomes stabilized, and capacitor 207 stores the voltage required to maintain $V_{out}$ at zero. Since the integrator's output voltage is added into the amplifier independently of $V_{in}$, the amplifier will maintain a zero offset condition during the actual measurement if the integrator's voltages do not change. This is accomplished by switching 200 to connect $V_{in}$ to the amplifier.

This self-zeroing feature can be used to correct for the voltage errors produced by the point-contact diodes at the two inner probes by keeping the integrator 204 connected to $V_{out}$ while the wafer is connected to the amplifier with no current flowing into the outer probes. In this condition, switch 200 is switched to connect $V_{in}$ to the amplifier 60 while switch 203 is in the position shown in FIG. 8. The input bias current for amplifier 202 will thus flow through the point-contact diode, and $V_{in}$ will be slightly different from zero due to the diode voltage drop. However, the integrator 204 will add in the proper voltage to force $V_{out}$ to zero. Since the bias current will remain essentially constant regardless of the magnitude of $V_{in}$, the diodes voltages will be eliminated from the data, thus allowing accurate measurements to be taken. The proper operation sequence is: With the constant current source 50 disabled, switch 200 connecting $V_{in}$ to the amplifier 60, and switch 203 connecting the integrator 204 to $V_{out}$, establish probe 1 contact with the wafer; allow a settling time for the integrator 204 to zero the amplifier 60 and switch 203 to ground the integrator's input and apply current to the wafer.

We claim:

1. Apparatus for measuring sheet resistivity of semiconductor materials and diffused layers comprising:
   pneumatically operated probe means for applying current to a material to be tested and for detecting a voltage created in the material to be tested by the current applied thereto, said probe means comprising a probe head having a body structure with a main pressure cavity, having first and second sealed inlets and a plurality of probe orifices and a plurality of probe pins fitted to the plurality of probe orifices and positioned therein for passing therethrough in response to pressure being applied to the main pressure cavity;
   a current source having high output impedance for producing a selected value of current at a range of voltages;
   self-zeroing voltage amplification means for amplifying the voltage detected by the probe means and producing an output in response to said voltage;
   means coupled to the first sealed inlet for connecting the current source and the self-zeroing amplification means to the plurality of probe pins;
   means coupled to the second sealed inlet for applying pressure to the main pressure cavity; and
   means for applying the probe head to a material to be tested, comprising a lever having a first and second end and pivoted at a point located between said first and second ends,
   means for coupling the probe head to the second end,
   a pneumatic cylinder coupled to the lever between the point and the second end for lowering the second end with reference to the first end in response to a control signal,
   an adjustable stop positioned to limit the movement of the first end,
   an interlocking system having a first and second microswitch, the first microswitch positioned to actuate when the first end communicates with the adjustable stop and the second microswitch positioned to actuate in response to a material to be tested being in a sample receiving position, and
   control means coupled to the first and second microswitches for producing a control signal in response to the probe head being in pin contact range of a material to be tested and the material being in a sample receiving position.

2. Apparatus as in claim 1 wherein the current source comprises:
   a reference voltage source;
   a differential amplifier having a first and a second transistor, a base of the first transistor being connected to the reference voltage source;
   a third transistor having an emitter coupled to a base of the second transistor;
   a fourth transistor having a base coupled to a collector of the first transistor, an emitter coupled to a collector of the second transistor and a collector coupled to a base of the third transistor; and
   an operational amplifier having an output and an input coupled to the collector of the third transistor.

3. Apparatus as in claim 2 wherein the reference voltage source comprises a biased Zener diode.

* * * * *